United States Patent [19]
Ushiku

[11] Patent Number: 5,185,279
[45] Date of Patent: Feb. 9, 1993

[54] METHOD OF MANUFACTURING INSULATED-GATE TYPE FIELD EFFECT TRANSISTOR

[75] Inventor: Yukihiro Ushiku, Yokohama, Japan

[73] Assignee: Kabushiki Kaisha Toshiba, Kawasaki, Japan

[21] Appl. No.: 673,669

[22] Filed: Mar. 22, 1991

Related U.S. Application Data

[60] Division of Ser. No. 395,356, Aug. 17, 1989, Pat. No. 5,028,552, which is a continuation-in-part of Ser. No. 175,305, Mar. 30, 1988, abandoned.

Foreign Application Priority Data

Mar. 31, 1987 [JP] Japan .................... 62-78512

[51] Int. Cl.⁵ .......................... H01L 21/265
[52] U.S. Cl. .......................... 437/41; 437/7; 437/45; 437/46; 437/913; 148/DIG. 82
[58] Field of Search ............ 437/41, 45, 46, 29, 437/56, 7, 913; 148/DIG. 82

[56] References Cited

U.S. PATENT DOCUMENTS 4,590,665  5/1986  Owens et al. ............. 148/DIG. 82
4,683,637  8/1987  Varker et al. ............. 148/DIG. 82

FOREIGN PATENT DOCUMENTS 0184768  10/1983  Japan ............................. 437/194

Primary Examiner—Brian E. Hearn
Assistant Examiner—Tuan Nguyen
Attorney, Agent, or Firm—Oblon, Spivak, McClelland, Maier & Neustadt

[57] ABSTRACT

A method of manufacturing an insulated-gate type field effect transistor includes the steps of forming an insulating film, on a semiconductor substrate, forming a first polycrystalline silicon layer on the insulating film, forming a second polycrystalline silicon layer on the frist polycrystalline silicon layer, patterning the first and second polycrystalline silicon layers to form a gate electrode and a masking layer, doping an impurity of a first conductivity type in the semiconductor substrate using the gate electrode and the masking layer as masks, thereby forming a source region and a drain region, starting etching the masking layer, detecting a natural oxide film on the gate electrode, stopping the etching, and ion-implanting an impurity of a second conductivity type in a region of the semiconductor substrate under the gate electrode through the gate electrode, thereby forming a channel-doped region. In this method, after the source and drain regions are formed, the impurity of the second conductivity type is ion-implanted in the substrate through the thin gate electrode to form the channel-doped region.

3 Claims, 5 Drawing Sheets

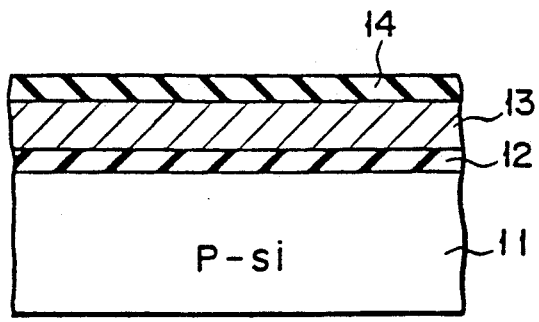
F I G. 2A
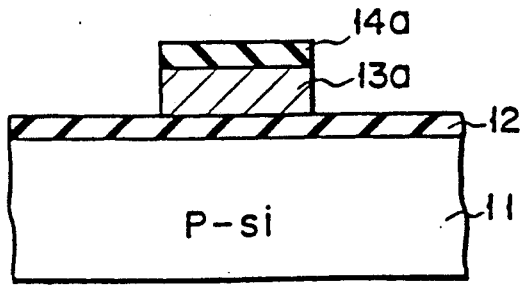
F I G. 2B

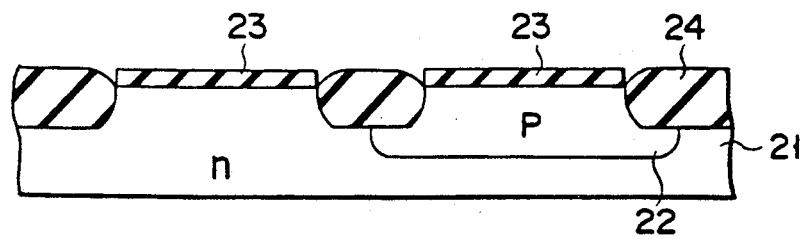
F I G. 4A
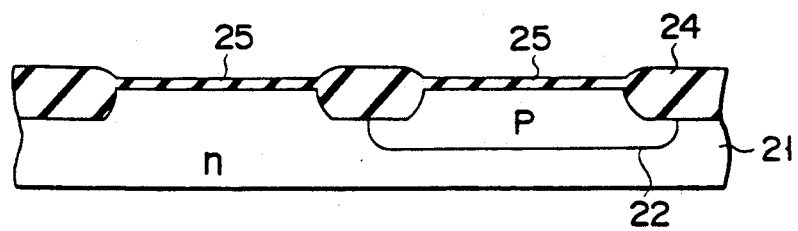
F I G. 4B
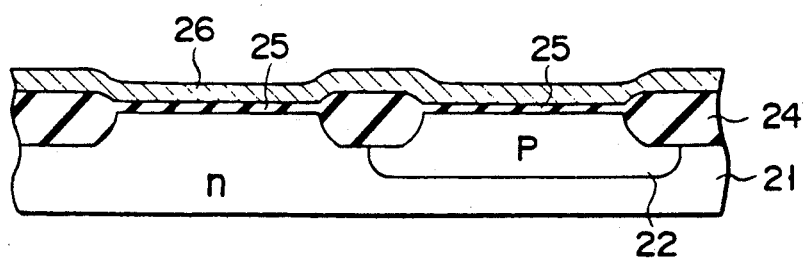
F I G. 4C
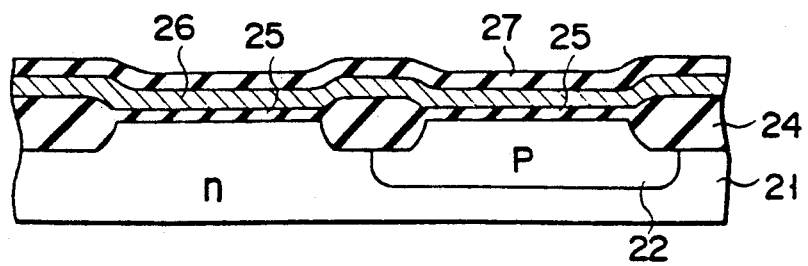
F I G. 4D

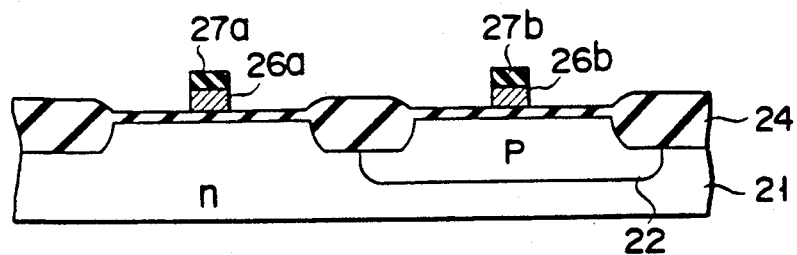
F I G. 4E
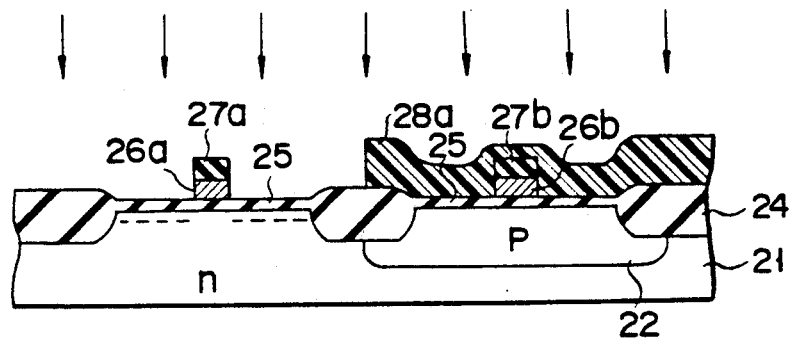
F I G. 4F
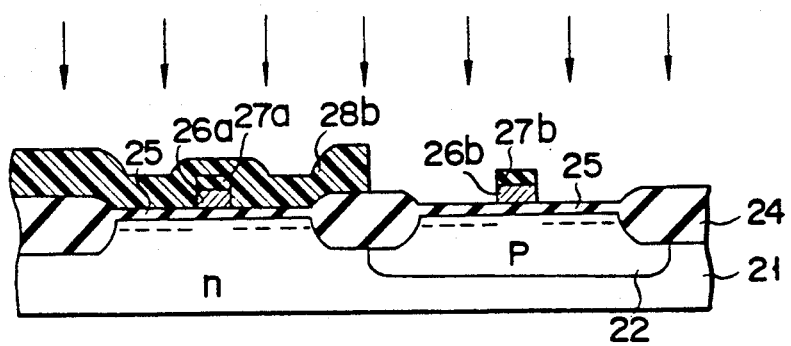
F I G. 4G
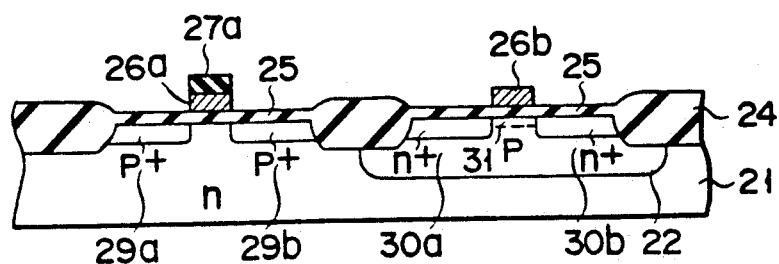
F I G 4H

METHOD OF MANUFACTURING INSULATED-GATE TYPE FIELD EFFECT TRANSISTOR

This is a division of application Ser. No. 07/395,356, filed on Aug. 17, 1989 now U.S. Pat. No. 5,028,552, which is a continuation in part of Ser. No. 07/175,305 filed on Mar. 30, 1988 now abandoned.

BACKGROUND OF THE INVENTION

1. Field of the Invention

The present invention relates to a method of manufacturing an insulated-gate type field effect transistor.

2. Description of the Related Art

An insulated-gate type field effect transistor (to be referred to as a MIS transistor hereinafter) in a conventional integrated circuit is manufactured as shown in FIGS. 1A to 1D.

As shown in FIG. 1A, insulating film 2 is formed on a surface of p-type Si substrate 1, and substrate 1 is subjected to ion implantation to form a channel-doped region 3 for controlling a threshold value. Then, as shown in FIG. 1B, using film 2 or after removing it, a gate insulating film is formed, and then polycrystalline silicon film 4 is deposited on an entire surface Thereafter, as shown in FIG. 1C, film 4 is patterned to form gate electrode 5. Finally, as shown in FIG. 1D, an impurity is ion-implanted using electrode 5 as a mask, thereby forming source region 6 and drain region 7.

The above conventional MIS transistor manufacturing method has the following problems.

A first problem is associated with the thickness of electrode 5. That is, in order to form source and drain regions 6 and 7 by ion-implanting the impurity using electrode 5 as a mask, the gate electrode must have a sufficient thickness. If the thickness of the gate electrode is not sufficient, the impurity is doped through the gate electrode and adversely affects an impurity concentration of a channel region. When polycrystalline silicon, which is a typical gate electrode material, is used as the gate electrode, the thickness of the gate electrode must be about 4,000 Å. That is, a thin gate electrode cannot be formed. Therefore, short-circuiting occurs due to discontinuity of an insulating film formed on a stepped portion of this thick gate electrode, and discontinuity of an interconnection layer formed thereon is generated.

In addition, since a selective etching ratio of the gate electrode to the gate insulating layer is small, if a thin gate electrode cannot be formed, a thin insulating film cannot be formed For this reason, it is difficult to form a fine MIS transistor. Normally, when the gate electrode consists of polycrystalline silicon having a thickness of 4,000 Å, the thickness of the gate insulating film must be 200 Å or more.

Another problem is associated with utilizing a thick gate electrode. It is difficult to perform ion-implantation through the thick gate electrode. For this reason, ion implantation to the channel region for controlling a threshold voltage must be performed before the gate electrode is formed. In this case, since the impurity in the channel region is rediffused in a thermal treatment step for activating the impurity in the source and drain regions, it is difficult to obtain sharp distribution of the impurity in the channel region. In general, the impurity concentration distribution of the channel region largely affects electrical characteristics of the MIS transistor. Especially, the impurity concentration near the surface of the channel region largely affects a threshold value, and the concentration inside the substrate largely affects punch-through characteristics or a substrate bias effect. Therefore, if the impurity concentration distribution of the channel region is not sharp, it is difficult to optimally control the threshold value, the punch-through characteristics, and the substrate bias effect.

As described above, according to the conventional MIS transistor manufacturing method, since the gate electrode must be sufficiently thick, large steps are formed on its surface, thereby degrading reliability of the device. Moreover, since ion implantation in the channel region is performed before formation of the gate electrode, it is difficult to optimally design the device characteristics.

SUMMARY OF THE INVENTION

It is, therefore, an object of the present invention to provide a semiconductor device manufacturing method which can improve reliability of a device and can easily design optimal device characteristics.

In a semiconductor device manufacturing method according to a first embodiment of the present invention, an insulating film is formed on a semiconductor substrate. Then, a first polycrystalline silicon layer and second polycrystalline silicon layer are formed on the insulating film. The first and second polycrystalline silicon layers are patterned to form a gate electrode and a masking layer. An impurity of a first conductivity type is doped in the semiconductor substrate using the gate electrode and the masking layer as masks, thereby forming a source region and a drain region. Etching of the masking layer is started. When a natural oxide film on the gate electrode is detected, the etching is stopped. Thereafter, an impurity of a second conductivity type is ion-planted in a region of the semiconductor substrate under the gate electrode through the gate electrode, thereby to form a channel-doped region.

In a semiconductor device manufacturing method according to a second embodiment of the present invention, a gate electrode is formed on a semiconductor substrate having a doped region of an impurity of a first conductivity type on its surface through a gate insulating film. Then, a masking layer is formed on the gate electrode, and an impurity of the first conductivity type is doped in the semiconductor substrate using the gate electrode and the masking layer as masks, thereby forming a source region and a drain region Thereafter, a supporting layer is formed on an entire surface and then is anisotropically etched and left on side surfaces of the gate electrode and the masking layer. Then, anisotropic etching is performed for the masking layer so that the masking layer remains at both upper end portions of the gate electrode. Subsequently, an impurity of a second conductivity type is ion-implanted in a region of the semiconductor substrate under the gate electrode through the gate electrode using the masking layer as a mask, thereby forming a channel-doped region.

In the above-described second embodiment of the present invention, an insulating material such as silicon nitride or silicon oxide, preferably, silicon oxide can be used as the masking layer. In addition, polycrystalline silicon or silicon oxide, preferably, polycrystalline silicon can be used to form the supporting layer Reactive ion etching can be performed as anisotropic etching.

Note that a thermal oxide film is preferably formed on side walls of the gate electrode before formation of the supporting layer.

According to the method of the present invention described above, a multilayer structure of the gate electrode and the masking layer formed thereon is used as a mask for forming the source and drain regions. Therefore, even if the gate electrode is thin, a significant masking effect with respect to ion implantation can be obtained. Therefore, by reducing the thickness of the gate electrode, the device can be flattened. In addition, since etching time for forming the gate electrode is short, damage to the gate insulating film on the source and drain regions is prevented and therefore the thin gate insulating film can be formed. As a result, according to the method of the present invention, a fine MIS transistor can be manufactured with high reliability.

Furthermore, ion implantation to the channel region is performed after formation of the source and drain regions. Therefore, the number of thermal treatments of the channel region after ion implantation can be reduced, and hence a sharp concentration distribution of the impurity in the channel region can be obtained. For this reason, controllability of characteristics of the MIS transistor can be improved.

Moreover, the masking layer on the gate electrode is removed before ion implantation in the channel region. Therefore, the channel region can be formed through the thin gate electrode at a relatively low accelerated voltage, and damage to the substrate upon ion implantation can be reduced.

According to, especially, the second embodiment of the present invention, a MIS transistor having an LDD structure with a short channel length can be manufactured.

BRIEF DESCRIPTION OF THE DRAWINGS

FIGS. 2A to 2E are sectional views showing steps in manufacturing a MIS transistor according to one embodiment of the present invention;

FIGS. 4A to 4H are sectional views showing steps in manufacturing a CMOS transistor according to a third embodiment of the present invention.

DETAILED DESCRIPTION OF THE PREFERRED EMBODIMENTS

Preferred embodiments of the present invention will be described in detail below with reference to the accompanying drawings.

Figure 1A:
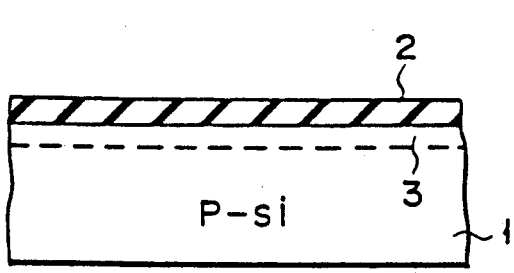
FIGS. 1A to 1D are sectional views showing steps in manufacturing a conventional MIS transistor.
Figure 1B:
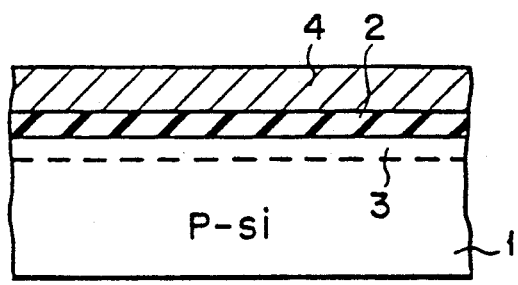
Figure 1C:
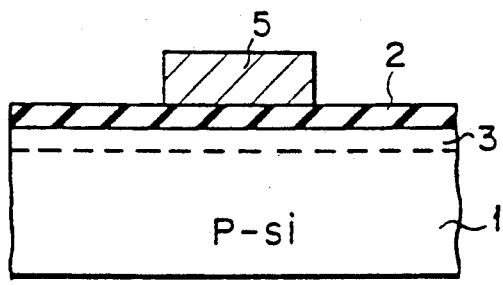
Figure 1D:
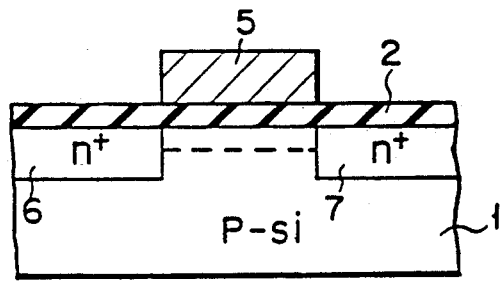
Figures 2C, 2D:
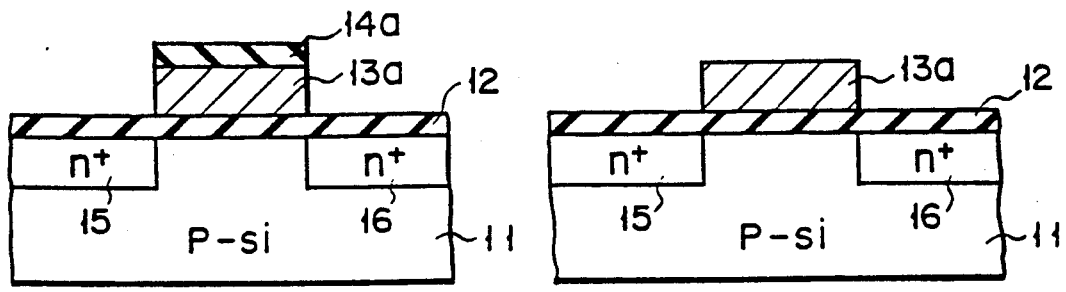

FIGS. 2A to 2E show steps in manufacturing a MIS transistor according to one embodiment of the present invention. First, as shown in FIG. 2A, thermal oxide film 12 (thickness: 100 Å) serving as a gate insulating film, and n-type first polycrystalline silicon film 13 (thickness: 2,000 Å) serving as a gate electrode are formed on p-type Si substrate 11 in a furnace. Si substrate 11 is taken out from the furnace to the air for a moment, thereby to form a natural oxide film having a thickness of about 20 Å on the surface of first polycrystalline silicon film 13. Then, Si substrate 11 is again introduced into the furnace, and second polycrystalline silicon film 14 (thickness: 1500 Å) serving as a masking layer is formed on first polycrystalline silicon film 13. Then a resist pattern is formed on second polycrystalline silicon film 14 by photolithography. Using this resist film as a mask, first and second polycrystalline silicon films 13 and 14 are etched by reactive ion etching. As a result, as shown in FIG. 2B, a two-layer mask pattern consisting of first and second polycrystalline silicon film patterns 13a and 14a are formed. At this time, since first and second polycrystalline silicon films 13 and 14 are thin, over etching can be reduced.

Thereafter, as shown in FIG. 2C, arsenic (As) ions are implanted using the two-layer mask pattern as a mask at an accelerated voltage of about 40 keV and then thermally treated, thereby forming n-type source and drain regions 15 and 16. At this time, implantation of As into the channel region is blocked by the two-layer mask pattern. The thermal treatment is performed in a nitrogen atmosphere at 900° C. for 60 minutes. As ions are activated by this thermal treatment.

Then, as shown in FIG. 2D, second polycrystalline film pattern 14a is removed by chemical dry etching or reactive ion etching. In this case, the end point of the etching is determined by detecting a natural oxide film on first polycrystalline silicon film pattern 13a. The presence of the natural oxide film is detected by a drop of potential of plasma. When silicon dioxide is exposed to plasma, potential of plasma drops.

Figure 2E:
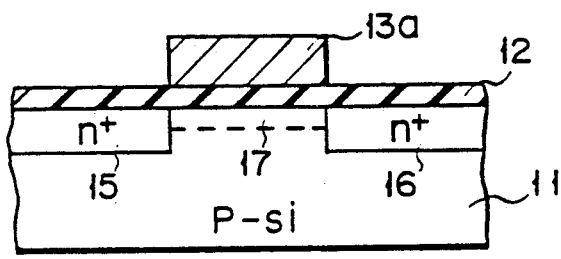

Boron ions are implanted into an entire surface and doped in the substrate through gate electrode 13a, thereby forming channel-doped region 17, as shown in FIG. 2E. In this case, if an accelerated voltage is about 70 keV, boron can reach the channel region. Thereafter, although not shown, an insulating material is deposited on the entire surface to form an inter-layer insulating layer, contact holes are formed in the inter-layer insulating layer, and a conductive layer is formed on the entire surface. The conductive layer is patterned to form a wiring layer. Note that the thermal treatment for activating boron in channel-doped region 17 can be performed at an arbitrary timing in the manufacturing steps. For example, this thermal treatment can be performed by a thermal treatment for flattening the inter-layer insulating layer.

According to the above embodiment, since the channel-doped region is formed after formation of the source and drain regions, rediffusion of the impurity in the channel-doped region can be prevented. As a result, a sharp concentration distribution can be obtained Therefore, a threshold value or a punch-through breakdown voltage can be easily optimized In addition, since the thickness of the gate electrode can be reduced, a structure can be flattened during manufacture of the device. As a result, reliability of the device can be improved. Further, the two-layer mask pattern is formed of polycrystalline silicon, and thus the patterning is very easy. Furthermore, since the thickness of the gate electrode can be reduce in a range of 500 to 2500 Å, damage to other regions can be reduced during formation of the gate electrode. Therefore, the thickness of the gate insulating film can also be reduced and hence a fine MIS transistor can be obtained.

Figures 3A, 3B:
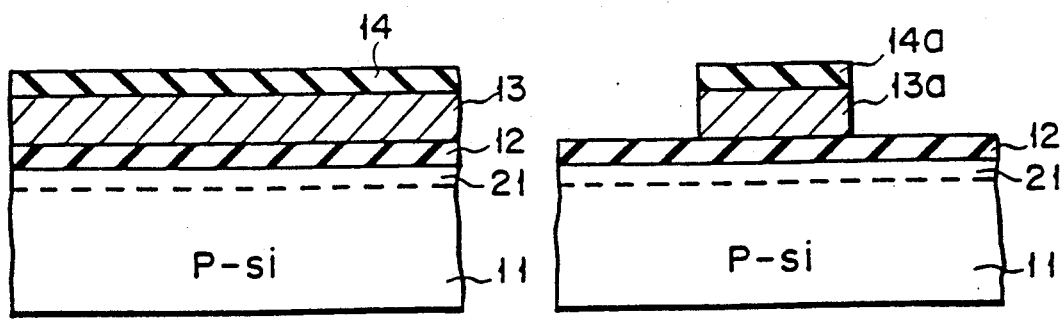
FIGS. 3A to 3G are sectional views showing steps in manufacturing a MIS transistor according to a second embodiment of the present invention.
Figure 3C:
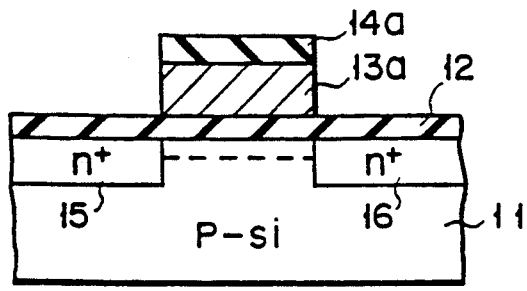
Figure 3D:
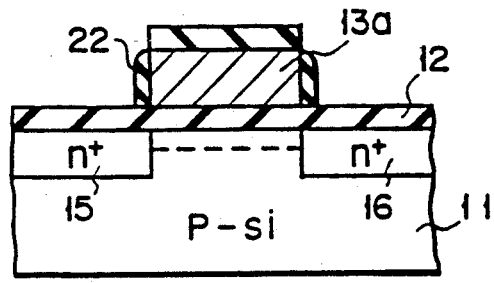
Figure 3E:
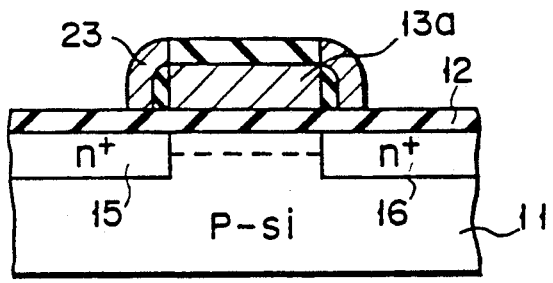

FIGS. 3A to 3G show steps in manufacturing a MIS transistor according to another embodiment of the present invention. Steps shown in FIGS. 3A to 3C are the same as those shown in FIGS. 2A to 2C except that n$^-$-As-doped region 21 having an impurity concentration of $1 \times 10^- cm^{-3}$ is formed on a substrate before forming thermal oxide film 12 and polycrystalline silicon film 13, and a detailed description thereof will be omitted After the step shown in FIG. 3C, the resultant structure is thermally treated in an oxygen atmosphere at 900° C., thereby forming thermal oxide film 22 having a thickness of 300 Å on side walls of gate electrode 13a, as shown in FIG. 3D. Then, polycrystalline silicon is deposited on an entire surface to form a polycrystalline silicon layer having a thickness of 1500 Å. This polycrystalline silicon layer is subjected to reactive ion etching so that polycrystalline silicon layer 23 remains on the side walls of gate electrode 13a, as shown in FIG. 3E.

Figure 3F:
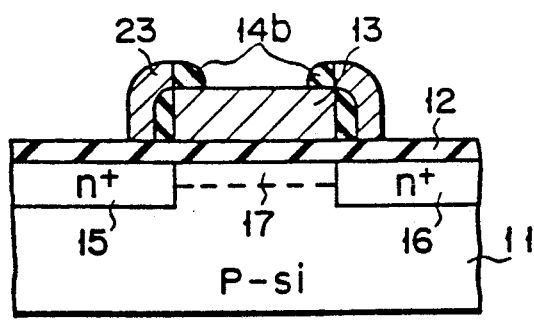

Thereafter, silicon nitride film 14a is subjected to reactive ion etching so that silicon nitride film 14b remains on both upper ends of gate electrode 13a, as shown in FIG. 3F.

Figure 3G:
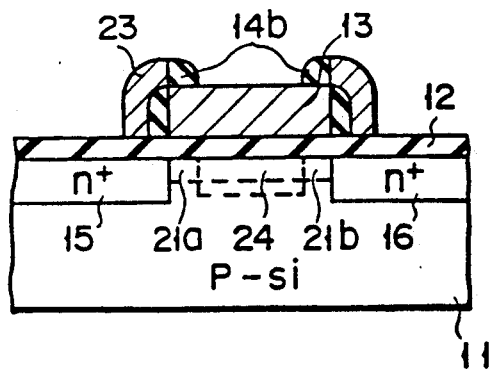

Boron ions are implanted on the entire surface and doped in the substrate through gate electrode 13a so as to compensate the impurity concentration of $n^-$-dope region 21, thereby forming channel-doped region 24, as shown in FIG. 3G.

Thereafter, in the same manner as the embodiment shown in FIGS. 2A to 2E, a MIS transistor having an LDD (lightly doped drain) structure with a short channel-doped region 24 and $n^-$-lightly doped regions 21a, 21b can be obtained.

According to the embodiment shown in FIGS. 3A to 3G, it is possible to easily control an impurity profile of channel-doped region 24. Furthermore, it is possible to control a channel length by the thickness of silicon nitride film 14b, thereby obtaining a transistor having a more stable operating characteristic than that of the conventional MIS transistor.

A method of manufacturing a complementary MOS transistor, which is another embodiment of the present invention, will now be described with reference to FIGS. 4A to 4H.

First, selective diffusion of boron is applied to an n-type silicon substrate 21, thereby forming a p-type well region 22 in the substrate 21, as is illustrated in FIG. 4A. Then, a patterned silicon nitride film 23 is formed by means of CVD (Chemical Vapor Deposition) on those portions of the substrate 21 in which the elements of the complementary MOS transistor will be formed. Further, selective oxidation is performed by using the patterned film 23 as anti-oxidation mask, thus forming a thick field oxide film 24 and isolating the element regions from each other, also as is illustrated in FIG. 4A. (It is desirable that a thick silicon oxide film be interposed between the silicon substrate 21 and the patterned silicon nitride film 23 before the selective oxidation is performed.) Next, the patterned silicon nitride film 23 is removed from the structure.

Then, as is shown in FIG. 4B, thermal oxidation is carried out in a dry oxidation atmosphere, thereby oxidizing the surfaces of the element regions and forming gate oxide films 25 having a thickness of 200 Å. Next, a polycrystalline silicon layer 26 having a thickness of 2000 Å and containing phosphorus in concentration of $1 \times 10^{20}$ cm$^{-3}$ is formed by means the CVD method on the entire surface of the structure, as is illustrated in FIG. 4C. Further, a silicon nitride layer 27, 1000 Å thick, is formed by the CVD method on the entire surface of the structure.

Thereafter, a resist pattern (not shown) is formed on the silicon nitride layer 27 by means of photolithography. Reactive ion etching is applied to the silicon nitride layer 27 and the polycrystalline silicon layer 26 by using the resist pattern as a mask. As a result, a first two-layer mask pattern consisting of a first silicon nitride pattern 27a and a first gate electrode 26a, and a second two-layer mask pattern consisting of a second silicon nitride pattern 27b and a second gate electrode 26b are formed, as is illustrated in FIG. 4E.

Next, a resist pattern 28a is formed on the n-channel element region only, as is shown in FIG. 4F. Then, boron ions are implanted into the p-channel element region at a dose of $5 \times 10^{15}$/cm$^2$ and acceleration voltage of 30 keV, by using the resist pattern 28a and the first two-layer mask pattern (26a, 27a), as is illustrated in FIG. 4F. The resist pattern 28a is then removed from the structure. Next, a resist pattern 28b is formed on the p-channel element region only, as is shown in FIG. 4G. The, arsenic ions are implanted into the p-channel element region at a dose of $5 \times 10^{15}$/cm$^2$ and acceleration voltage of 40 keV, by using the resist pattern 28b and the second two-layer mask pattern (26b, 27b), as is illustrated in FIG. 4G. The resist pattern 28b is then removed from the structure.

Further, the entire structure is heat-treated at 1000° C. for 30 minutes, thus activating the impurities contained in the structure. As a result, a source region 29a and a drain region 29b, both $p^+$-type, are formed in the p-channel element region, whereas a source region 30a and a drain region 30b, both $n^+$-type, are formed in the n-channel element region, as is shown in FIG. 4H. Then, the silicon nitride pattern 27b is removed from the n-channel element region, and boron ions are implanted into the p-type well region 22 through the second gate electrode 26 at dose of $2 \times 10^{14}$/cm$^3$ and acceleration voltage of 70 keV, thereby forming a channel-doped region 31 in the p-type well region 22 as is shown in FIG. 4H.

Thereafter, the silicon nitride pattern 27a is removed from the structure, and the same steps of the other embodiments, described above, are performed. A CMOS transistor is thereby manufactured In the last-described method of manufacturing a CMOS transistor, as well as in the previously described ones, the impurity does not diffuse into the channel region during the implantation of the impurity ions into the source and drain regions, and no punch-through occurs. It suffices to apply a relatively low acceleration voltage to achieve the ion implantation into the channel region since the impurity ions are implanted into the channel region through a thin polycrystalline silicon layer. Therefore, no exclusive machine needs to be used for a high acceleration voltage, and the channel region has a sharp impurity profile Further, since no heat treatment needs to be continued long after the ion implantation into the channel region, the impurity profile of the channel region remains sharp, whereby punch-though is suppressed.

Moreover, since the gate electrode is still thin when the insulating layer is formed on it, it is easy to make the insulating layer flat.

It should be noted that a resist layer can be used as a mask to form the source and drain regions, in order to manufacture only a p-channel MOS transistor or a p-channel MOS transistor, but cannot be used as such in order to manufacture a CMOS transistor.

What is claimed is:

1. A method of manufacturing an insulated-gate type field effect transistor, comprising the steps of:

forming an insulating film, on a semiconductor substrate;

forming a first polycrystalline silicon layer on said insulating film;

forming a natural oxide film on said first polycrystalline layer;

forming a second polycrystalline silicon layer on said natural oxide film;

patterning said first polycrystalline silicon layers, said natural oxide film, and said second polycrystalline silicon layers to form a gate electrode and a masking layer;

doping an impurity of a first conductivity type in said semiconductor substrate using said gate electrode and said masking layer as masks, thereby forming a source region and a drain region;

starting etching said masking layer;

detecting said natural oxide film on said gate electrode;

stopping the etching; and ion-implanting an impurity of a second conductivity type in a region of said semiconductor substrate under said gate electrode through said gate electrode, thereby forming a channel-doped region.

2. A method according to claim 1, wherein said etching of said masking layer is performed in a plasma atmosphere, and said detecting of the natural oxide film on said gate electrode is performed by measuring a potential of the plasma.

3. A method according to claim 1, wherein a thickness of said gate electrode is 500 to 2500 Å.

* * * * *